US010957689B2

(12) United States Patent
Noguchi et al.

(10) Patent No.: US 10,957,689 B2
(45) Date of Patent: Mar. 23, 2021

(54) SEMICONDUCTOR APPARATUS AND MODULE

(71) Applicant: SONY SEMICONDUCTOR SOLUTIONS CORPORATION, Kanagawa (JP)

(72) Inventors: Kenji Noguchi, Kanagawa (JP); Toshiyuki Koimori, Kanagawa (JP); Hiroaki Nagano, Tokyo (JP); Masaya Uemura, Tokyo (JP); Megumi Nakayama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/494,149

(22) PCT Filed: Jan. 31, 2018

(86) PCT No.: PCT/JP2018/003252
§ 371 (c)(1),
(2) Date: Sep. 13, 2019

(87) PCT Pub. No.: WO2018/173497
PCT Pub. Date: Sep. 27, 2018

(65) Prior Publication Data
US 2020/0013772 A1    Jan. 9, 2020

(30) Foreign Application Priority Data

Mar. 22, 2017   (JP) ................................. 2017-055787

(51) Int. Cl.
*H01L 27/06*    (2006.01)
*H01L 49/02*    (2006.01)

(52) U.S. Cl.
CPC .......... *H01L 27/0629* (2013.01); *H01L 28/60* (2013.01)

(58) Field of Classification Search
CPC ........................... H01L 27/0629; H01L 28/60
See application file for complete search history.

(56) References Cited

U.S. PATENT DOCUMENTS 5,701,107 A * 12/1997 Kasahara ................. H03H 7/20
333/139
2010/0264988 A1* 10/2010 Huang .................... H03F 1/223
330/277

(Continued)

FOREIGN PATENT DOCUMENTS

| JP | H11-136111 | 5/1999 |
| JP | 2011-249466 | 12/2011 |
| JP | 2016-171498 | 9/2016 |

OTHER PUBLICATIONS

International Search Report prepared by the Japan Patent Office dated Apr. 13, 2018, for International Application No. PCT/JP2018/003252.

*Primary Examiner* — Allan R Wilson
(74) *Attorney, Agent, or Firm* — Sheridan Ross P.C.

(57) ABSTRACT

Provided is a semiconductor apparatus capable of enhancing the withstand voltage while suppressing the enlargement of the chip area. Provided is semiconductor apparatus including: a first terminal to which a high frequency signal is supplied; a second terminal from which the high frequency signal is output; first, second and third switch elements electrically connected in series between the first terminal and the second terminal; a first capacitor provided between the first terminal and a first node between the first switch element and the second switch element; and a second capacitor provided between the first terminal and a second node between the second switch element and the third switch element, in which the capacitance of the first capacitor is greater than the capacitance of the second capacitor.

17 Claims, 8 Drawing Sheets

(56) References Cited

U.S. PATENT DOCUMENTS

2011/0294445 A1 12/2011 Goto et al.
2014/0312958 A1 10/2014 Ranta et al.
2016/0269025 A1 9/2016 Kunishi et al.
2017/0155321 A1* 6/2017 Kidera .................. H02M 7/483

* cited by examiner

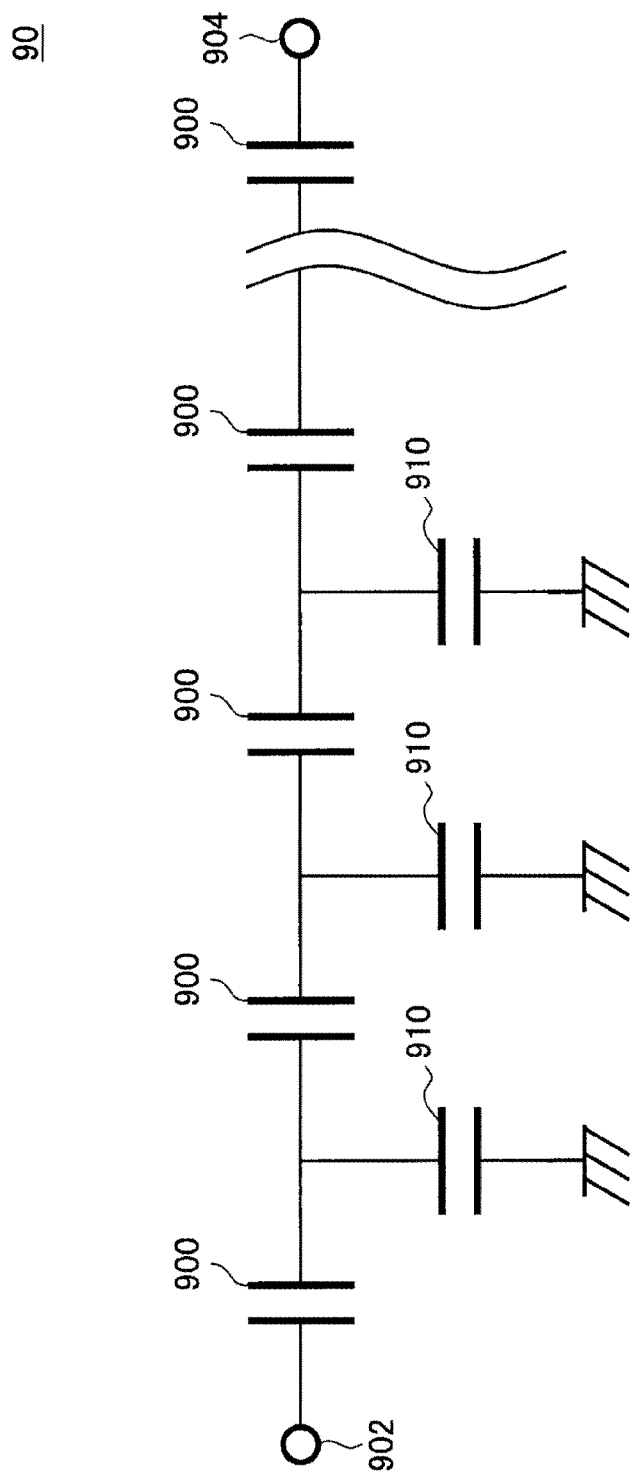

SEMICONDUCTOR APPARATUS AND MODULE

CROSS REFERENCE TO RELATED APPLICATIONS

This application is a national stage application under 35 U.S.C. 371 and claims the benefit of PCT Application No. PCT/JP2018/003252 having an international filing date of 31 Jan. 2018, which designated the United States, which PCT application claimed the benefit of Japanese Patent Application No. 2017-055787 filed 22 Mar. 2017, the entire disclosures of each of which are incorporated herein by reference.

TECHNICAL FIELD

The present disclosure relates to a semiconductor apparatus and a module.

BACKGROUND ART

A high frequency switch for switching high frequency signals is provided at the front end of a portable terminal, such as a portable telephone, used in a mobile communication system. As a switch element of such a high frequency switch, a compound (such as GaAs) based field effect transistor (FET) has been used. Moreover, recently, a silicon based FET, which uses a silicon on insulator (SOI) substrate that can be consolidated with peripheral circuits (e.g., a frequency conversion circuit and the like) including silicon based devices, is also beginning to be used as the above-described switch element.

In the high frequency switch, a plurality of the above-mentioned compound based or silicon based FETs is used as the switch elements, and a multistage configuration, in which the plurality of FETs is electrically connected in series, is employed to ensure a desired withstand voltage. One example of the high frequency switch that employs such a multistage configuration is a semiconductor apparatus disclosed in Patent Document 1 below.

CITATION LIST

Patent Document

Patent Document 1: Japanese Patent Application Laid-Open No. H11-136111

SUMMARY OF THE INVENTION

Problems to be Solved by the Invention

However, in a case where the multistage configuration, in which the plurality of FETs is connected in series, is employed, the withstand voltage is enhanced, but the chip area of the high frequency switch is enlarged, making the increase in the manufacturing cost difficult to be suppressed. Furthermore, even in a case where the above-described multistage configuration is employed, a high voltage is locally applied to a specific FET, and the FET to which the high voltage is applied is likely to be broken down. Thus, the enhancement of the withstand voltage by the multistage configuration has been limited.

Accordingly, the present disclosure proposes a novel and improved semiconductor apparatus and module capable of enhancing a withstand voltage while suppressing the enlargement of a chip area.

Solutions to Problems

According to the present disclosure, provided is semiconductor apparatus including: a first terminal to which a high frequency signal is supplied; a second terminal from which the high frequency signal is output; first, second and third switch elements electrically connected in series between the first terminal and the second terminal; a first capacitor provided between the first terminal and a first node between the first switch element and the second switch element; and a second capacitor provided between the first terminal and a second node between the second switch element and the third switch element, in which the capacitance of the first capacitor is greater than the capacitance of the second capacitor.

Furthermore, according to the present disclosure, provided is a semiconductor apparatus including: a first terminal to which a high frequency signal is supplied; a second terminal from which the high frequency signal is output; a plurality of switch elements electrically connected in series between the first terminal and the second terminal; and a plurality of capacitors each provided between the first terminal and each node between two of the switch elements adjacent to each other, in which the capacitances of the respective capacitors sequentially become small in order of the switch elements connected to the capacitors starting from the first terminal.

Moreover, according to the present disclosure, provided is a high frequency module including: a semiconductor apparatus including: a first terminal to which a high frequency signal is supplied; a second terminal from which the high frequency signal is output; first, second and third switch elements electrically connected in series between the first terminal and the second terminal; a first capacitor provided between the first terminal and a first node between the first switch element and the second switch element; and a second capacitor provided between the first terminal and a second node between the second switch element and the third switch element, the capacitance of the first capacitor being greater than the capacitance of the second capacitor; and at least one of a high frequency component, a signal processing apparatus, and an arithmetic apparatus

Effects of the Invention

As described above, according to the present disclosure, it is possible to provide a semiconductor apparatus and a module capable of enhancing the withstand voltage while suppressing the enlargement of the chip area.

Note that the above-described effects are not necessarily limited, and any one of the effects shown in this specification or other effects grasped from this specification may be exerted together with the above-described effects or instead of the above-described effects.

BRIEF DESCRIPTION OF THE DRAWINGS

FIG. 9 is an equivalent circuit diagram of the semiconductor apparatus 90 according to the comparative example.

MODE FOR CARRYING OUT THE INVENTION

Figure 1:
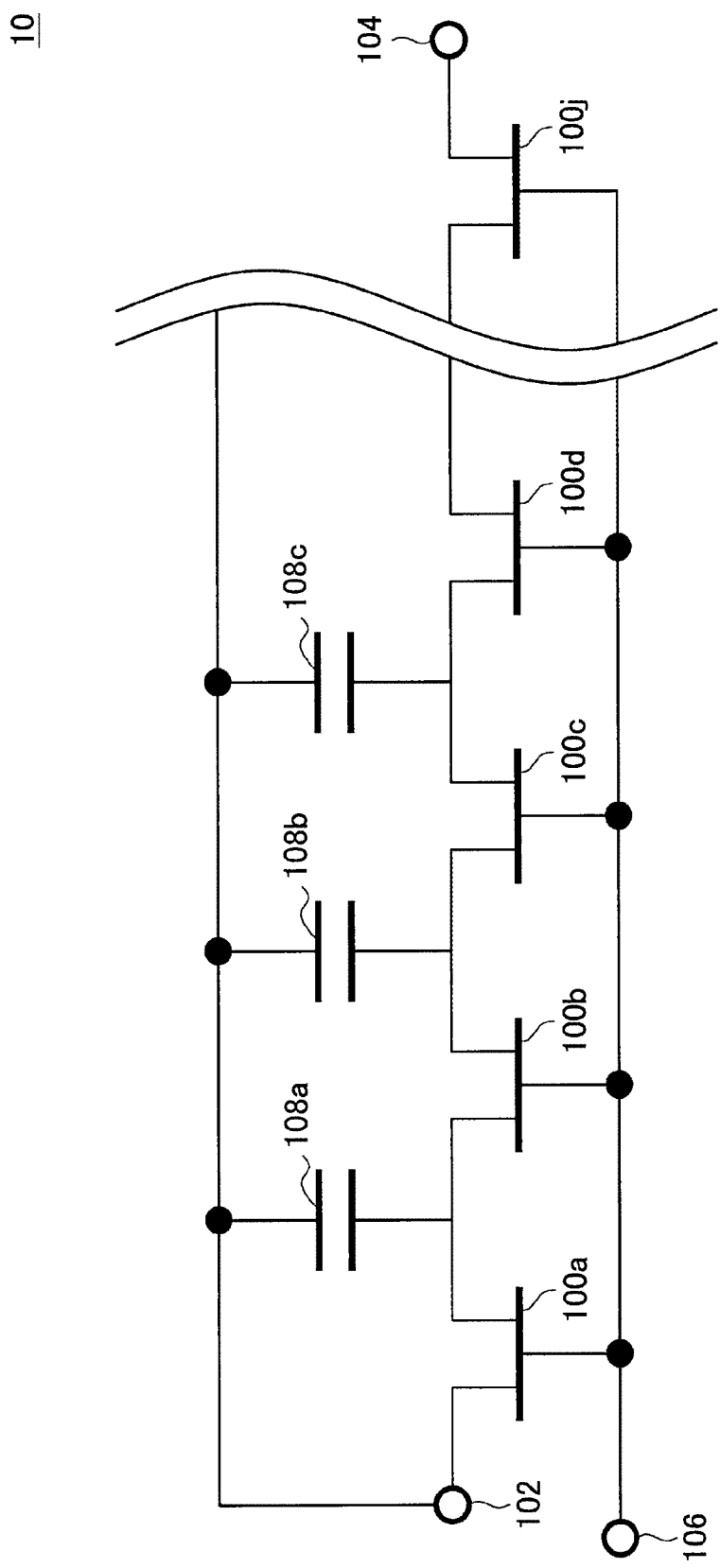
FIG. 1 is a circuit diagram of a semiconductor apparatus 10 according to an embodiment of the present disclosure.

Hereinafter, preferred embodiments of the present disclosure will be described in detail with reference to the accompanying drawings. Note that, in this specification and the drawings, constituents having substantially the same functional configurations are denoted by the same reference signs to omit redundant explanations.

Furthermore, in this specification and the drawings, a plurality of constituents having substantially the same or similar functional configurations is distinguished by adding different numerals after the same reference signs in some cases. However, in a case where it is not necessary to distinguish in particular each of the plurality of constituents having substantially the same or similar functional configurations, only the same reference signs are used. Moreover, similar constituents in different embodiments are distinguished by adding different alphabets after the same reference signs in some cases. However, in a case where it is not necessary to distinguish each of the similar constituents in particular, only the same reference signs are used.

Further, the drawings referred in the following description are drawings that help the explanation and understanding of one embodiment of the present disclosure, and the shapes, dimensions, ratios and the like shown in the drawings are different from the actual ones in some cases for the sake of clarity. Moreover, the designs of a semiconductor apparatus and the like shown in the drawings can be changed as appropriate by taking the following description and known technologies into account. Furthermore, in the following description, the vertical direction of the laminated structures of the semiconductor apparatus and the like corresponds to the relative direction of a case where the face of the substrate, on which elements such as transistors are provided, is up, and is different from the vertical direction of the laminated structure of the semiconductor apparatus in some cases, for example, when this semiconductor apparatus is incorporated into a semiconductor package.

In the following description, the mathematical expressions (e.g., linear and exponential expressions) of values for circuit elements and the like and the expressions of the shapes of the laminated films in semiconductor apparatus do not only mean the same values as mathematically defined numerical values or geometrically defined shapes, but also encompass a case where there an industrially acceptable difference or the like in the manufacturing process of the semiconductor apparatus, and shapes similar to those shapes.

Further, in the following description, a "gate" refers to a gate electrode of a field effect transistor (FET). A "drain" refers to a drain electrode or drain region of the FET, and a "source" refers to a source electrode or source region of the FET.

Moreover, in the following description, in the circuit configuration of the semiconductor apparatus, "connection" means to electrically connect a plurality of elements unless otherwise specified. In addition, the "connection" in the following description does not only encompass a case where the plurality of elements is directly and electrically connected, but also a case where the plurality of elements is indirectly and electrically connected through other elements.

Note that the description will be given in the following order.

1. Background of Creating Embodiments According to the Present Disclosure
2. Embodiments According to the Present Disclosure
2.1. Circuit Configuration
2.2. Planar Structure
2.3. Cross-Sectional Structure
2.4. Examples
3. Summary
4. Supplement 1. Background of Creating Embodiments According to the Present Disclosure Embodiments according to the present disclosure described hereinafter relate to a high frequency switch used in a terminal apparatus such as a portable telephone, and more particularly relate to a high frequency switch used in a communication terminal that transmits and receives high frequency signals having a frequency of 3 GHz or less. However, the embodiments according to the present disclosure are not limited to the application of such devices and may be applied to other devices. First, before the embodiments according to the present disclosure are described, the background of creating the present embodiments by the inventors will be described.

Figure 7:
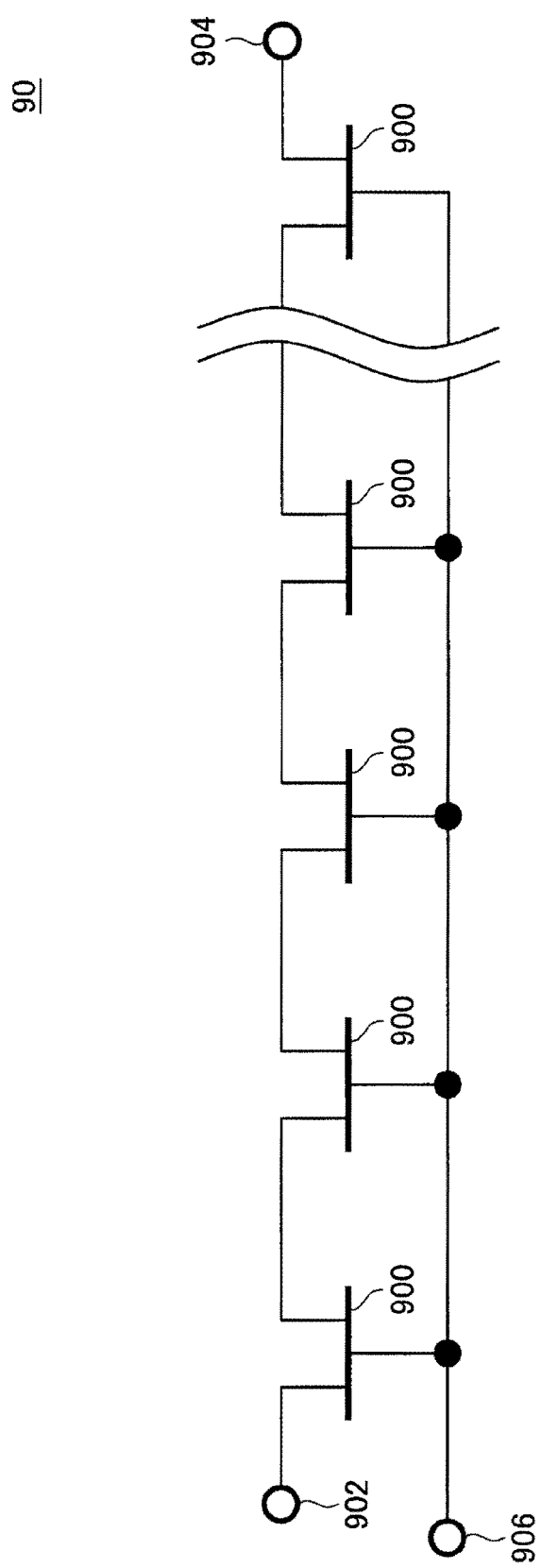
FIG. 7 is a circuit diagram of a semiconductor apparatus 90 according to a comparative example.

As previously described, the above-mentioned communication terminal is provided with the high frequency switch that switches high frequency signals. In such a high frequency switch, a field effect transistor (FET) is used as a switch element, and a multistage configuration, in which a plurality of FETs is electrically connected in series, is employed in order to ensure a desired withstand voltage. Hereinafter, the circuit configuration of a semiconductor apparatus 90 (hereinafter, this semiconductor apparatus 90 is called a semiconductor apparatus 90 according to a comparative example) which has been studied by the inventors will be described with reference to FIG. 7. FIG. 7 is a circuit diagram of the semiconductor apparatus 90 according to the comparative example.

As shown in FIG. 7, a multistage configuration, in which a plurality of FETs 900 is electrically connected in series between a first terminal (e.g., an input terminal) 902, to which a high frequency signal is supplied, and a second terminal (e.g., an output terminal or an earth terminal) 904 that outputs the high frequency signal, is provided. Particularly, as shown in FIG. 7, the plurality of FETs 900 is connected in series by connecting the sources and drains of two FETs 900 adjacent to each other. Moreover, the gates of the respective FETs 900 are electrically connected to each other and connected to a third terminal (e.g., a control terminal) 906. Note that 10 FETs 900 are supposed to be connected in FIG. 7 although the illustration is omitted. In other words, suppose that the semiconductor apparatus 90 according to the comparative example has a multistage configuration of 10 stages of the FETs 900.

Furthermore, the circuit diagram of FIG. 7 schematically shows one example of the circuit configuration of the semiconductor apparatus 90 according to the comparative example as a high frequency switch, and this semiconductor apparatus 90 is not limited to having the circuit configuration of FIG. 7. For example, in the semiconductor apparatus 90, a resistance element (not shown) may be provided between the gate of each of the FETs 900 and the third terminal 906, and other elements not shown in FIG. 7 may be provided at any place.

In the semiconductor apparatus 90 according to the comparative example, the withstand voltage of the semiconductor apparatus 90 was enhanced by employing the multistage configuration as shown in FIG. 7. In other words, in the semiconductor apparatus 90 according to the comparative example, the FETs 900 are stacked in multiple stages, and the withstand voltages of these FETs 900 are synthesized to enhance the withstand voltage of the semiconductor apparatus 90. By enhancing the withstand voltage of the semiconductor apparatus 90 in this manner, the FETs 900 provided in the semiconductor apparatus 90 can be less likely to be broken down even if the voltage applied to the first terminal 902 is high.

However, in the case where the multistage configuration is employed, the withstand voltage is enhanced as mentioned above, but the chip area of the semiconductor apparatus 90 is enlarged, making the increase in the manufacturing cost difficult to be suppressed. Moreover, according to the study of the inventors, even in the case where the multistage configuration is employed, a high voltage is locally applied to a specific FET 900 in the semiconductor apparatus 90, and this FET 900 is in a state of being likely to be broken down. Thus, it was found that the enhancement of the withstand voltage by the multistage configuration is limited. In other words, in the semiconductor apparatus 90 according to the comparative example, the withstand voltage of the semiconductor apparatus 90 does not simply become the additional value of the withstand voltages of the plurality of FETs 900. Therefore, the withstand voltage of the semiconductor apparatus 90 could not have been increased linearly (an increase amount could not have been constant) even if the stack number of the FET 900 was simply increased.

Figure 8:
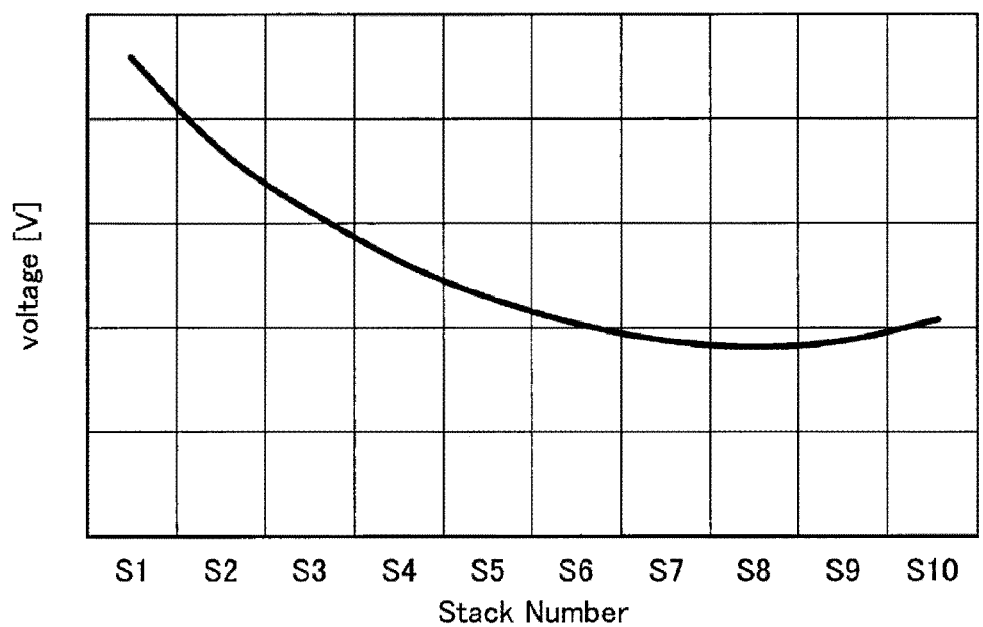
FIG. 8 is a graph showing values of voltages applied to the FETs 900 of the respective stages of the semiconductor apparatus 90 according to the comparative example.

Hereinafter, the limit of the enhancement of the withstand voltage by the multistage configuration studied by the inventors will be described with reference to FIG. 8. FIG. 8 is a graph showing values of voltages applied to the FET 900 of the respective stages of the semiconductor apparatus 90 according to the comparative example, in which the results obtained by the inventors using a circuit simulator are graphed. Particularly, in FIG. 8, the horizontal axis indicates the stack number of the FET 900, and the vertical axis indicates the applied voltage. Note that the stack number of the FET 900 is assigned to each of the FETs 900 so that the number increases sequentially from the first terminal 902 side toward the second terminal 904 side.

As shown in FIG. 8, the voltages applied to the FETs 900 of the respective stages of the semiconductor apparatus 90 according to the comparative example are uneven. Particularly, in the FETs 900 of the first to fourth stages, the voltages decrease as the stack number increases. In other words, a higher voltage is applied to the FET 900 closer to the first terminal 902 to which a high frequency signal is supplied (in FIG. 8, the closer to the left, the closer to the first terminal 902). On the other hand, a lower voltage is applied to the FET 900 farther from the first terminal 902 (in FIG. 8, the closer to the right, the farther from the first terminal 902). Then, substantially constant voltages are applied to the FETs 900 of the sixth to tenth stages. Therefore, it can be seen that the FETs 900 close to the first terminal 902 (e.g., the FETs 900 of the first to third stages) are in a state of being likely to be broken down since the high voltages are locally applied thereto.

Because the voltage applied to the FET 900 of each stage is not even, in other words, there is an FET 900 to which a high voltage is locally applied, there are restrictions on the state of this FET 900, and the withstand voltage of the semiconductor apparatus 90 does not simply have an additional value of the withstand voltages of the plurality of FETs 900. Therefore, in the semiconductor apparatus 90 according to the comparative example, even if the stack number of the FET 900 is simply increased, the withstand voltage of the semiconductor apparatus 90 cannot be increased linearly. Thus, it was found that the effective enhancement of the withstand voltage by the multistage configuration is limited.

As shown in FIG. 8, the reason that the voltages applied to the FETs 900 of the respective stages in the semiconductor apparatus 90 are not even is considered to be due to the parasitic capacitances of the respective FETs 900. Hereinafter, the parasitic capacitances of the respective FETs 900 will be described with reference to FIG. 9. FIG. 9 is an equivalent circuit diagram of the semiconductor apparatus 90 according to the comparative example. Particularly, in the equivalent circuit diagram of FIG. 9, each of the FETs 900 is indicated by a capacitor symbol. Moreover, in the equivalent circuit of FIG. 9, the parasitic capacitance of each of the FET 900 is illustrated as a parasitic capacitance 910.

As shown in FIG. 9, the FETs 900 of the respective stages have the parasitic capacitances 910 between itself and the earthed substrate. Furthermore, since the magnitude of each of the parasitic capacitances 910 is defined by the structure, size, arrangement on the substrate, and the like of each of the FETs 900, the magnitudes of the plurality of parasitic capacitances 910 are often not the same. In other words, the magnitudes of the plurality of parasitic capacitances 910 are uneven. Due to such uneven parasitic capacitances 910, the FETs 900 of the respective stages appear as FETs 900 having uneven characteristics from input high frequency signals even if the FETs 900 of the respective stages have the same structure and size. Therefore, since the characteristics of the FETs 900 are uneven, the voltages applied to the FETs 900 of the respective stages are assumed to be uneven.

Accordingly, it is conceivable to devise the device structure, arrangement, and the like of each of the FETs 900 on the basis of the above-mentioned assumption to make the parasitic capacitances 910 even, thereby making the voltages applied to the FETs 900 of the respective stages even. If the voltages applied to the FETs 900 of the respective stages can be made even, there is no FET 900 to which a high voltage is locally applied. Thus, there is no restriction on the withstand voltage of the semiconductor apparatus 90 from the FET 900 to which the high voltage is locally applied. As a result, by increasing the stack number of the FET 900, the withstand voltage of the semiconductor apparatus 90 can be increased linearly. In other words, the withstand voltage can be effectively enhanced by the multistage configuration.

However, it is difficult to control the parasitic capacitances 910 to a desired value by the device design and the like as mentioned above. Moreover, since there are restrictions on the structure and arrangement of the FETs 900, the flexibility of the device design is lessened. Thus, the above-mentioned device design method cannot be said to be a preferable solution.

Under such circumstances, the inventors have intensively studied to obtain a semiconductor apparatus capable of enhancing the withstand voltage while suppressing the enlargement of the chip area. Then, the inventors have come to create one embodiment of the present disclosure described hereinafter. Particularly, according to the embodiment of the present disclosure, it is possible to provide a semiconductor apparatus capable of enhancing the withstand voltage while suppressing the enlargement of the chip area. Hereinafter, the details of the one embodiment of the present disclosure created by the inventors will be described.

2. Embodiments According to the Present Disclosure

2.1. Circuit Configuration

First, the circuit configuration of a semiconductor apparatus 10 according to the embodiment of the present disclosure will be described with reference to FIG. 1. FIG. 1 is a circuit diagram of a semiconductor apparatus 10 according to the present embodiment.

As shown in FIG. 1, in the semiconductor apparatus 10 according to the present embodiment, a multistage configuration, in which a plurality of field effect transistors (FETs) (switch elements) 100 is electrically connected in series between a first terminal (e.g., an input terminal) 102, to which a high frequency signal is supplied, and a second terminal (e.g., an output terminal or an earth terminal) 104 that outputs the high frequency signal, is provided. In other words, a multistage configuration is provided also in the present embodiment, as in the semiconductor apparatus 90 according to the above-mentioned comparative example. More specifically, as shown in FIG. 1, in the present embodiment, 10 FETs 100a to j (some are not shown in the drawing) are provided such that the FET (first switch element) 100a of the first stage, the FET (second switch element) 100b of the second stage, the FET (third switch element) 100c of the third stage, and so on are provided from the first terminal 102 side toward the second terminal 104 side. Furthermore, as in the above-mentioned comparative example, in the present embodiment, the plurality of FETs 100a to j is connected in series by connecting the sources and drains of two FETs 100 adjacent to each other. Moreover, the gates of the respective FETs 100a to j are electrically connected to each other and connected to a third terminal (e.g., a control terminal) 106.

Note that, in the present embodiment, the semiconductor apparatus 10 is not limited to having the 10 FETs 100a to j as shown in FIG. 1 and is not limited in particular as long as the semiconductor apparatus 10 has two or more FETs 100.

Furthermore, in the semiconductor apparatus 10 according to the present embodiment, unlike the semiconductor apparatus 90 according to the comparative example shown in FIG. 7, each of a plurality of capacitors 108 is provided between the first terminal 102 and each node positioned between two FETs 100 adjacent to each other. Note that the above-described capacitors 108 may be provided between the first terminal 102 and all the nodes positioned between two FETs 100 adjacent to each other or may be provided only between the first terminal 102 and some nodes. Moreover, the capacitance of each of the capacitors 108 is selected so that the voltages applied to the FETs 100a to j of the respective stages become even. Note that nine capacitors 108 are supposed to be provided in FIG. 1 although some are omitted in the drawing.

In the present embodiment, even in a case where the FETs 100a to j of the respective stages appear to have uneven characteristics from the high frequency signal input due to the parasitic capacitances 910, the FETs 100a to j are made to appear to have even characteristics from the above-described high frequency signal by providing the above-described capacitors 108. Therefore, according to the present embodiment, since the characteristics of the FETs 100a of the respective stages become even, the voltages applied to the FETs 100 of the respective stages can be made even. As a result, there is no FET 100 to which a high voltage is locally applied. Thus, there is no restriction on the withstand voltage of the semiconductor apparatus 10 by the FET 100 to which the high voltage is locally applied, and the withstand voltage can be effectively enhanced according to the provided stack number. Furthermore, according to the present embodiment, since a desired withstand voltage can be obtained without using many FETs 100, it is possible to avoid the enlargement of the chip area of the semiconductor apparatus 10 and suppress the increase in the manufacturing cost.

Particularly, in the present embodiment, the capacitance of each of the capacitors 108 preferably becomes small sequentially as the stack number (i.e., the order starting from the first terminal 102) of the FETs 100a to j connected to these capacitors 108 increases. More specifically, referring to FIG. 1 to explain, the capacitance of the capacitor (first capacitor) 108a provided between the first terminal 102 and a node (first node) between the FET 100a and the FET 100b is greater than the capacitance of the capacitor (second capacitor) 108b provided between the first terminal 102 and a node (second node) between the FET 100b and the FET 100c. Further, the capacitance of the capacitor 108b is greater than the capacitance of the capacitor 108c provided between the first terminal 102 and a node between the FET 100c and the FET 100d.

As shown in FIG. 8 mentioned above, the voltages applied to the FETs 100 of the respective stages sequentially decrease as the stack number of the FETs 100a to j increases. Accordingly, the capacitances of the capacitors 108 connected to the FETs 100 of the respective stages are sequentially reduced to cope with the transition of the above-described voltages as the stack number of the FETs 100a to j increases. Thus, by sequentially reducing the capacitances of the respective capacitors 108 as the stack number of the FETs 100a to j connected to these capacitors 108 increases, the voltages applied to the FETs 100 of the respective stages can be made even.

Figure 3:
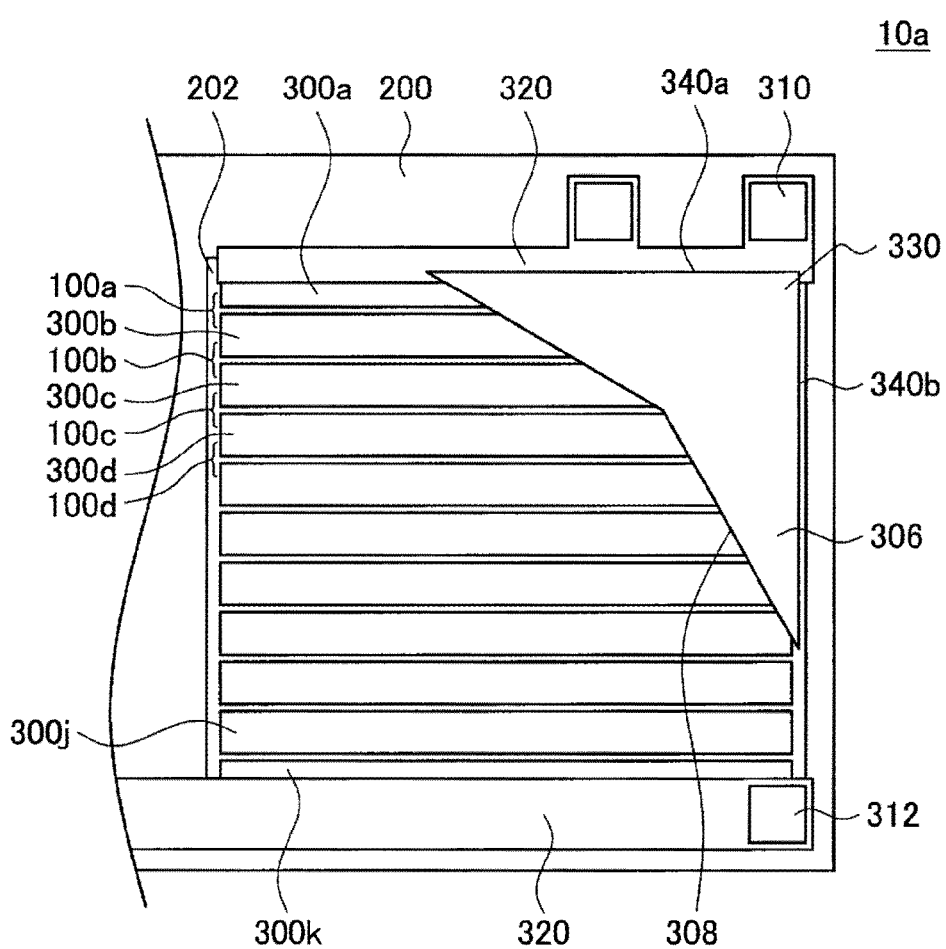
FIG. 3 is a plan view of a semiconductor apparatus 10a according to a modification example of the embodiment of the present disclosure.

Moreover, in the present embodiment, the capacitances of the respective capacitors 108 may be sequentially reduced linearly as the stack number of the FETs 100a to j connected to these capacitors 108 increases, but it is more preferable to sequentially reduce the capacitances of the capacitors 108 exponentially. As shown in FIG. 3 mentioned above, since the voltages applied to the FETs 100 of the respective stages sequentially decrease exponentially as the stack number of the FETs 100a to j increases, the capacitances of the capacitors 108 connected to the FETs 100 of the respective stages are sequentially reduced as mentioned above to cope with the transition of the voltages. In other words, by sequentially reducing the capacitances of the respective capacitors 108 exponentially as the stack number of the FETs 100a to j connected to these capacitors 108 increases, the voltages applied to the FETs 100 of the respective stages can be made more even.

Note that the semiconductor apparatus 10 according to the present embodiment may be configured by a plurality of units with the circuit configuration shown in FIG. 1 as one unit. In addition, the semiconductor apparatus 10 according to the present embodiment may include elements and the like not shown in FIG. 1.

2.2. Planar Structure

Figure 2:
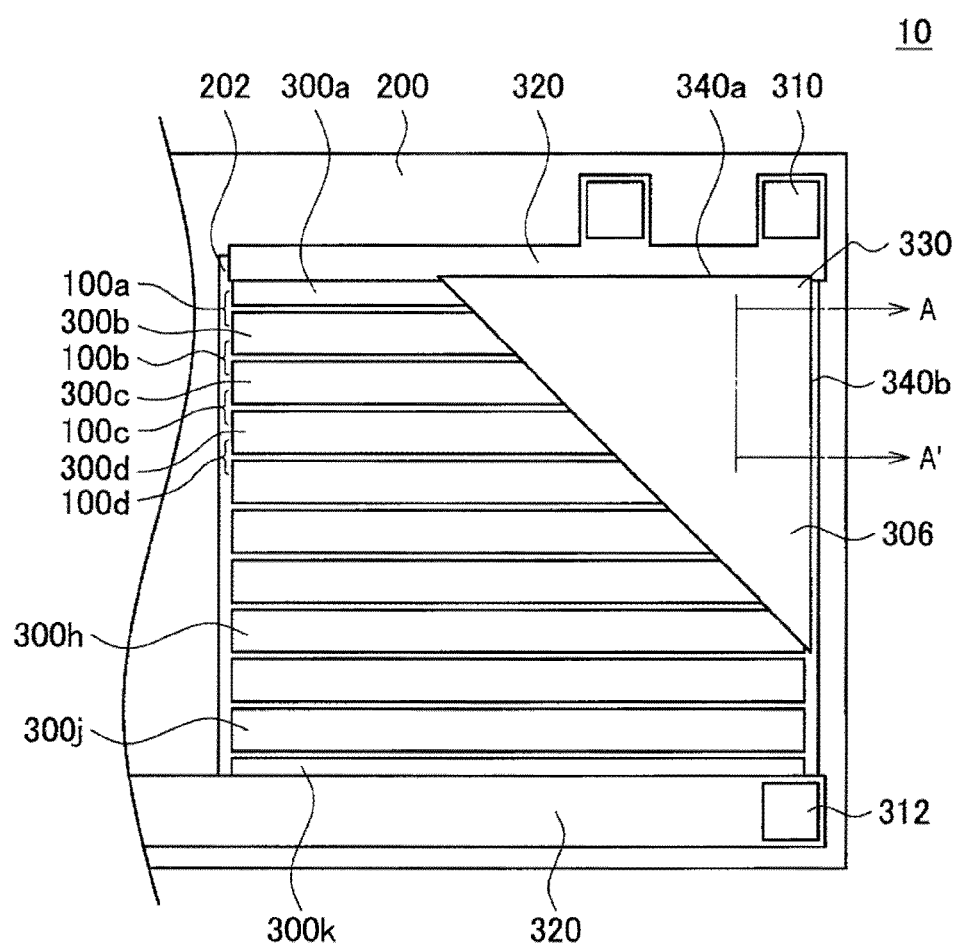
FIG. 2 is a plan view of the semiconductor apparatus 10 according to the same embodiment.

Next, the planar structure of the semiconductor apparatus 10 having the circuit configuration shown in FIG. 1 will be described with reference to FIG. 2. FIG. 2 is a plan view of the semiconductor apparatus 10 according to the present embodiment, and particularly is a plan view showing part of the semiconductor apparatus 10.

As shown in FIG. 2, the semiconductor apparatus 10 according to the present embodiment has the plurality of FETs 100 provided on a semiconductor substrate 200. The semiconductor substrate 200 is, for example, a silicon substrate, a SiGe substrate, an SOI substrate in which an insulating film (called a buried oxide (BOX) layer) of $SiO_2$ or the like is inserted into a silicon substrate, a compound semiconductor substrate, or the like and is not limited in particular. Note that the semiconductor substrate 200 is preferably a high-resistance substrate in order to lower the parasitic capacitances 910 of the FETs 100 and enhance the high frequency characteristics of these FETs 100. Furthermore, in the following description, an SOI substrate is supposed to be used as the semiconductor substrate 200 of the semiconductor apparatus 10.

As shown in FIG. 2, an active region 202 is provided on the semiconductor substrate 200. In this active region 202, 10 FETs 100a to j are provided to be aligned along the vertical direction in FIG. 2. Particularly, on the active region 202, a plurality of source/drain electrodes 300a to k each stretching in the horizontal direction in FIG. 2 is provided as the electrodes of the respective FETs 100a to j at predetermined intervals along the vertical direction in FIG. 2. Moreover, the FETs 100a to j adjacent to each other are electrically connected in series by sharing one source/drain electrode 300.

Further, in FIG. 2, an electrode pad 310 for the first terminal 102 to which a high frequency signal is supplied is provided on the upper side of the active region 202. The source/drain electrode 300a of the FET 100a of the first stage is electrically connected to the above-described electrode pad 310 through a wiring layer 320 provided on the semiconductor substrate 200.

Furthermore, in FIG. 2, an electrode pad 312 for the second terminal 104 from which a high frequency signal is output is provided on the lower side of the active region 202. The source/drain electrode 300k of the FET 100j of the tenth stage is electrically connected to the above-described electrode pad 312 through the wiring layer 320 provided on the semiconductor substrate 200.

Then, in the semiconductor apparatus 10 according to the present embodiment, a metal film 306 is provided above the source/drain electrodes 300a to k of the respective FETs 100a to j through an insulating film (not shown). This metal film 306 is provided to overlap each of the source/drain electrodes 300a to k positioned thereunder through the insulating film, thereby forming parallel-plate capacitors. In other words, the metal film 306 and each of the source/drain electrodes 300a to k overlap each other through the insulating film to form each of the capacitors 108 in FIG. 1. More specifically, the source/drain electrode 300b shared by the FET 100a of the first stage and the FET 100b of the second stage and a portion of the metal film 306 overlapping this source/drain electrode 300b form the capacitor 108a in FIG. 1. Furthermore, the source/drain electrode 300c shared by the FET 100b of the second stage and the FET 100c of the third stage and a portion of the metal film 306 overlapping this source/drain electrode 300c form the capacitor 108b in FIG. 1. Moreover, the metal film 306 is electrically connected to the wiring layer 320 at the upper end portion in the drawing, and thus the metal film 306 is electrically connected to the electrode pad 310 for the first terminal 102.

In the present embodiment, as previously described, the voltages applied to the FETs 100 of the respective stages can be made even by providing the plurality of capacitors 108 using the metal film 306. Further, according to the present embodiment, since the plurality of capacitors 108 can be formed by providing the metal film 306 above each of the source/drain electrodes 300, the structure and arrangement of the FETs 100 do not need to be changed because the capacitors 108 are provided in this manner. In other words, in the present embodiment, since the circuit configuration and layout configuration of the existing semiconductor apparatus can be utilized as they are, it is possible to avoid the drastic change of the circuit configuration and layout configuration of the semiconductor apparatus. In addition, according to the present embodiment, the flexibility of the device design of the FETs 100 and the like can be maintained as before.

Particularly, in the present embodiment, the metal film 306 preferably has a shape such that the areas which overlap the source/drain electrodes 300a to k of the respective FETs 100 become sequentially small as the stack number of the FETs 100a to j positioned under this metal film 306 increases. Therefore, the metal film 306 shown in FIG. 2 has a shape so as to narrow from the top toward the bottom in the drawing. More specifically, as shown in FIG. 2, the area of the portion (first metal film) of the metal film 306 overlapping the source/drain electrode 300b shared by the FET 100a of the first stage and the FET 100b of the second stage is greater than the area of the portion (second metal film) of the metal film 306 overlapping the source/drain electrode 300c shared by the FET 100b of the second stage and the FET 100c of the third stage. Moreover, the area of the portion of the metal film 306 overlapping the source/drain electrode 300c shared by the FET 100b of the second stage and the FET 100c of the third stage is greater than the area of the portion of the metal film 306 overlapping the source/drain electrode 300d shared by the FET 100c of the third stage and the FET 100d of the fourth stage. By shaping the metal film 306 in this way, it is possible to form the plurality of capacitors 108 whose capacitances sequentially become small as the stack number of the connected FETs 100a to j increases.

For example, the metal film 306 may have a right angled isosceles triangle shape as shown in FIG. 2. This right angled isosceles triangle has a right angle 330 overlapping the right end of the source/drain electrode 300a of the FET 100a of the first stage. One side 340a sandwiching this right angle 330 extends along the source/drain electrode 300a of the FET 100a of the first stage, and the other side 340b extends along the right ends of the source/drain electrodes 300a to k of the plurality of FETs 100a to j in the vertical direction in the drawing. In other words, the metal film 306 in FIG. 2 has a shape such that the areas overlapping the source/drain electrodes 300 of the respective FETs 100 linearly become small as the stack number of the FETs 100*a* to *j* positioned under this metal film 306 increases. By shaping the metal film 306 in this way, it is possible to form the plurality of capacitors 108 whose capacitances sequentially become small linearly as the stack number of the connected FETs 100*a* to *j* increases. Note that, in FIG. 2, the metal film 306 of the right angled isosceles triangle overlap the source/drain electrodes 300*a* to *h* from the source/drain electrode 300*a* of the FET 100*a* of the first stage to the source/drain electrode 300*h* shared by the FET 100*g* of the seventh stage and the FET 100*h* of the eighth stage. However, the metal film 306 according to the present embodiment is not limited to the size as shown in FIG. 2 and may, for example, overlap the source/drain electrodes 300*a* to *j* from the source/drain electrode 300*a* of the FET 100*a* of the first stage to the source/drain electrode 300*j* shared by the FET 100*i* of the ninth stage and the FET 100*j* of the tenth stage.

Moreover, a modification example of the metal film 306 will be described with reference to FIG. 3. FIG. 3 is a plan view of a semiconductor apparatus 10*a* according to the modification example of the present embodiment. A metal film 306*a* shown in FIG. 3 has a right angled isosceles triangle shape similar to the metal film 306 in FIG. 2, but has a shape in which the hypotenuse of this isosceles triangle is replaced by a polygonal line 308. Particularly, this polygonal line 308 has a shape that follows an exponential curve. By shaping the metal film 306*a* in this way, it is possible to form a plurality of capacitors 108 whose capacitances sequentially become small exponentially as the stack number of the connected FETs 100*a* to *j* increases.

Note that the polygonal line 308 in FIG. 3 is a polygonal line in which two straight lines are combined, but this polygonal line 308 is preferably an exponential curve or a polygonal line having a shape approximated by this curve. In this way, the metal film 306*a* in FIG. 3 can have a shape such that the areas overlapping the source/drain electrodes 300 of the respective FETs 100 exponentially become small as the stack number of the FETs 100*a* to *j* positioned under this metal film 306*a* increases. As a result, it is possible to form the plurality of capacitors 108 whose capacitances sequentially become small exponentially as the stack number of the connected FETs 100*a* to *j* increases so that the voltages applied to the FETs 100 of the respective stages can be made more even. However, due to the layout design rules applied to the manufacturing process of the semiconductor apparatus 10 and the processing accuracy, there are restrictions on the shape of the processable metal film 306*a*. Thus, it is preferable to shape the metal film 306*a* with the polygonal line 308 as close as possible to an exponential curve in consideration of the manufacturing cost and the manufacturing time under these restrictions.

Note that the metal film 306 is not limited to being formed as the integrated metal film as shown in FIGS. 2 and 3 and may be formed by a plurality of the metal films 306 spaced apart from each other for the source/drain electrodes 300 of the FETs 100*a* to *j*. More specifically, for example, the plurality of metal films 306 may be positioned at the same layer in the laminated structure laminated on the semiconductor substrate 200 and may each have a belt-like shape stretching along the direction in which the above-described source/drain electrodes 300*a* to *k* stretch. Furthermore, it is preferable to sequentially shorten the lengths of the plurality of metal films 306 in the longitudinal direction as the stack number of the FETs 100*a* to *j* positioned under the respective metal films 306 increases. In other words, the plurality of metal films 306 may have shapes like a histogram, which extend along the source/drain electrodes 300*a* to *k* of the respective FETs 100*a* to *j* and are sequentially shortened as the stack number of the FETs 100*a* to *j* positioned under the respective metal films 306 increases. In this case, each of the metal films 306 is electrically connected to an electrode pad 310 for a first terminal 102 by a wiring layer (not shown), a contact via (not shown) or the like. Since such a plurality of metal films 306 is positioned at the same layer in the laminated structure laminated on the semiconductor substrate 200, the metal films 306 can be formed in the same process so that the increase in the manufacturing cost of the semiconductor apparatus 10 can be suppressed. Moreover, such a plurality of belt-like metal films 306 may be coupled to each other to be a stepwise integrated metal film.

As described above, the shape and size of the metal film 306 according to the present embodiment are not limited to those shown in FIGS. 2 and 3, and the metal film 306 may have a different shape as long as the capacitors 108 capable of making the voltages applied to the FETs 100 of the respective stages even can be formed.

Further, the metal films 306 and 306*a* in FIGS. 2 and 3 may be formed by a metal film provided on the outermost surface of the laminated structure on the semiconductor substrate 200. This metal film formed on the outermost surface may be formed by, for example, a rewiring layer (RDL) that electrically connects a terminal (e.g., a solder bump or the like), which is provided outside the package incorporating the semiconductor apparatus 10, with the electrode pad 310 or the like of the semiconductor apparatus 10. Furthermore, the metal film 306 is not limited to being formed by the metal film formed on the outermost surface of the laminated structure on the semiconductor substrate 200 and may be formed by a metal film positioned at a layer in the middle of the laminated structure. In particular, in a case where the FETs 100 are miniaturized and the parasitic capacitances 910 of the respective FETs 100 change accordingly, the capacitances of the capacitors 108, which are provided to make the voltages applied to the FETs 100 of the respective stages even, are required to be changed according to the changes in the parasitic capacitances in some cases. The capacitance of each of the capacitors 108 formed by each of the metal films 306 together with each of the source/drain electrodes 300 positioned thereunder is determined by an overlapping area of each of the metal films 306 and each of the source/drain electrodes 300, a dielectric constant of the insulating film (not shown) sandwiched between the metal films 306 and each of the source/drain electrodes 300, and the distance between the metal films 306 and each of the source/drain electrodes 300. Therefore, in order to change the capacitances of the capacitors 108, the metal film 306 is provided at a layer close to each of the source/drain electrodes 300 in some case. In these cases, for example, a metal film positioned at a layer in the middle of the above-described laminated structure will be used.

Moreover, in a case where the above-described metal film 306 is a plurality of metal films 306 spaced apart from each other, the plurality of metal films 306 does not have to be positioned at the same layer in the laminated structure laminated on the semiconductor substrate 200. In this case, the overlapping area of each of the metal films 306 and each of the source/drain electrodes 300 is determined in consideration of the distance between the metal film 306 and the corresponding source/drain electrode 300.

Note that the semiconductor apparatus 10 according to the present embodiment may be configured by a plurality of units with the planar structure shown in the plan views of FIGS. 2 and 3 as one unit. Further, the semiconductor apparatus 10 according to the present embodiment is not limited to the planar structure shown in the plan views of FIGS. 2 and 3 and may include other elements and the like.

2.3. Cross-Sectional Structure

Figure 4:
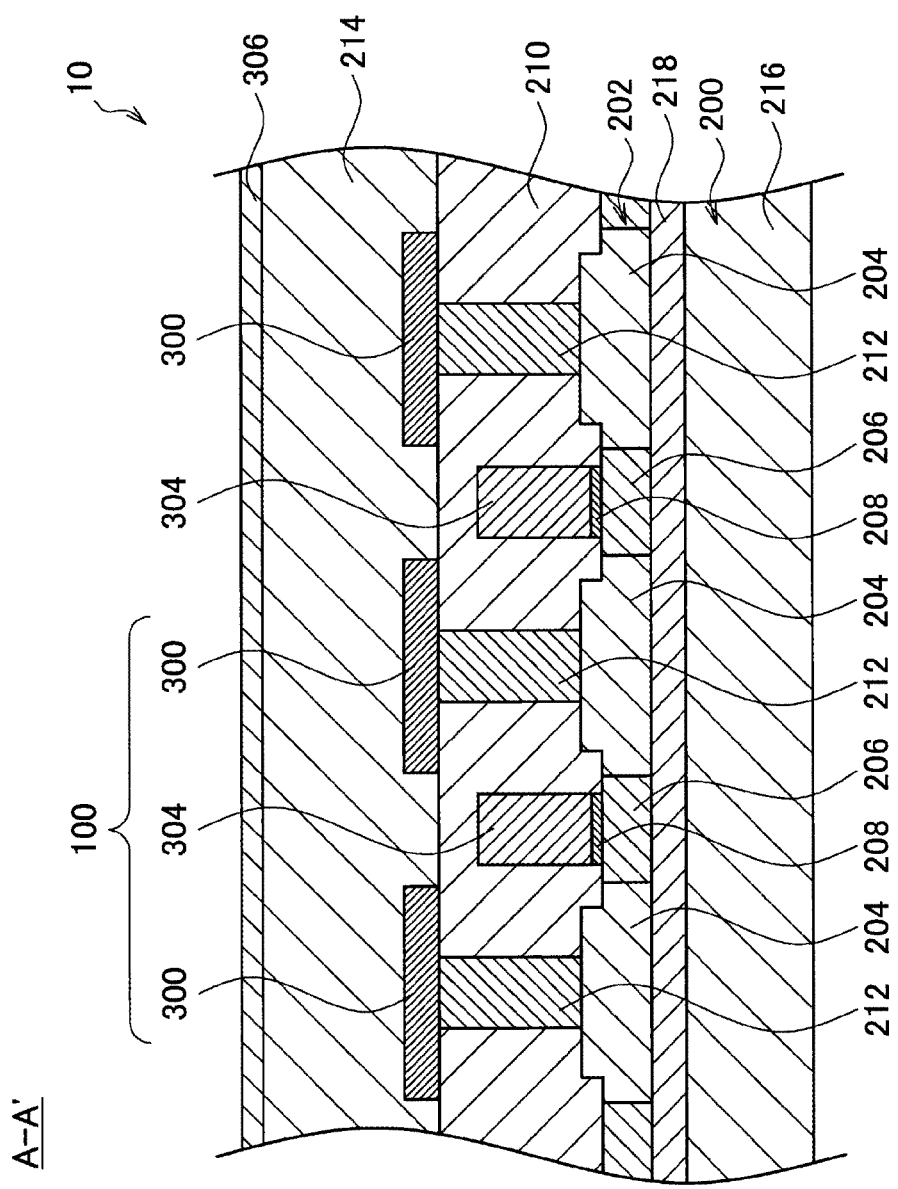
FIG. 4 is a cross-sectional view of the semiconductor apparatus 10 according to the same embodiment.

Next, the cross-sectional structure of the semiconductor apparatus 10 in FIG. 2 will be described with reference to FIG. 4. FIG. 4 is a cross-sectional view of the semiconductor apparatus 10 according to the present embodiment, corresponding to the cross section of a case where the semiconductor apparatus 10 is cut off along the line A-A' in FIG. 2.

As shown in FIG. 4, the semiconductor apparatus 10 according to the present embodiment has the plurality of FETs 100 provided on one face of the semiconductor substrate 200. Note that each of the FETs 100 is supposed to be an n-type FET herein. However, in the present embodiment, each of the FETs 100 is not limited to the n-type FET and may be a p-type FET.

As previously described, the semiconductor substrate 200 is, for example, a silicon substrate, a SiGe substrate, an SOI substrate, a compound semiconductor substrate, or the like and is not limited in particular. Note that, in the following description, the semiconductor substrate 200 is supposed to be an SOI substrate. Therefore, in the semiconductor substrate 200 shown in FIG. 4, a BOX layer 218 including an insulating film of $SiO_2$ or the like is provided on a support substrate 216 including silicon.

Moreover, the active region 202 including silicon is provided at a surface layer portion of the BOX layer 218. The active region 202 functions as a source/drain region and a channel region of each of the FETs 100. More specifically, the active region 202 is provided with n-type active regions 204 into which n-type impurities (e.g., phosphorus (P), arsenic (As), or the like) are introduced. The n-type active regions 204 are spaced apart at predetermined intervals. Region sandwiched between the n-type active regions 204 are provided with p-type active regions 206 into which p-type impurities (e.g., boron (B) or the like) are introduced. Note that the above-described n-type active regions 204 correspond to the source/drain regions of the respective FETs 100, and the above-described p-type active regions 206 correspond to the channel regions of the respective FETs 100.

Gate electrodes 304 are provided on the above-described p-type active regions 206 through insulating films 208 formed by silicon oxide films or the like. The gate electrodes 304 include, for example, polysilicon films or the like containing impurities and the like. Note that the gate electrodes 304 are not limited to such polysilicon films and may include metal films of titanium (Ti), platinum (Pt), gold (Au) or the like, metal nitride films of TiN or the like, or silicide films which is a compound of silicon and a different metal.

Further, an insulating film 210 formed by a silicon oxide film or the like is provided so as to cover the surface of the semiconductor substrate 200 and the gate electrodes 304. Furthermore, contact vias 212 penetrating the insulating film 210 are provided on the above-described n-type active regions 204. In the contact vias 212, metal films of tungsten (W) or the like are embedded.

Then, the source/drain electrodes 300 electrically connected to the contact vias 212 are provided on the insulating film 210. The source/drain electrodes 300 include, for example, metal films of copper (Cu) or the like.

Further, an insulating film 214 formed by a silicon oxide film, a resin of polyimide or the like, or the like is provided to cover the insulating film 210 and the source/drain electrodes 300. Moreover, the metal film 306 is provided above the source/drain electrodes 300 and on the insulating film 214. This metal film 306 is formed by, for example, plating with a metal film of Cu, Au, nickel (Ni), aluminum (Al) or the like. As previously described, the metal film 306 is provided so as to overlap the source/drain electrodes 300, thereby forming the parallel-plate capacitors 108. Furthermore, an end portion of the metal film 306 is, for example, connected to the wiring layer 320 by the contact vias 212 and electrically connected to the electrode pad 310 for the first terminal 102 through the contact vias 212 and the wiring layer 320.

Note that the semiconductor apparatus 10 according to the present embodiment is not limited to having the cross-sectional structure as shown in FIG. 4 and may be provided with other layers (not shown). Moreover, the semiconductor apparatus 10 according to the present embodiment has been described as having the FETs 100 provided on the SOI substrate in the above description, but is not limited to this and may have, for example, compound (such as GaAs) based FETs Further, the material of each layer of the semiconductor apparatus 10 mentioned above is exemplary, and the existing material used in the semiconductor apparatus 10 can be used for each layer described above. Furthermore, the shape, thickness, and the like of each layer are preferably selected as appropriate according to the characteristics required for the semiconductor apparatus 10.

Moreover, the semiconductor apparatus 10 according to the present embodiment can be manufactured by using a method, an apparatus and conditions, which are used to manufacture a general semiconductor apparatus and a semiconductor package. For example, the semiconductor apparatus 10 according to the present embodiment can be manufactured by using a sputtering method, a chemical vapor deposition (CVD) method, a photolithography method, an etching method, a chemical mechanical polish (CMP) method, metal plating, and the like as appropriate. In other words, the semiconductor apparatus 10 according to the present embodiment can be easily and inexpensively manufactured by using the existing semiconductor apparatus manufacturing process.

2.4. Examples

The details of the one embodiment of the present disclosure have been described above. Next, the one embodiment of the present disclosure will be more specifically described by showing specific examples. Note that the examples shown below are merely examples of the one embodiment of the present disclosure, and the one embodiment of the present disclosure is not limited to the following examples.

The voltage values applied to FETs 100 of the respective stages in semiconductor apparatuses 10 and 10a of Example 1 and Example 2, which correspond to the embodiment of the present disclosure, and in a semiconductor apparatus 90 of a comparative example were examined. Hereinafter, the semiconductor apparatuses 10, 10a and 90 according to Examples 1 and 2 and the comparative example will be described.

Example 1

Example 1 is the semiconductor apparatus 10 as shown in FIG. 2. Particularly, the semiconductor apparatus 10 according to Example 1 has a multistage configuration of 10 FETs 100 and has a metal film 306 which is positioned above source/drain electrodes 300 of these FETs 100 and has a right angled isosceles triangle shape as shown in FIG. 2. Moreover, this metal film 306 overlaps the source/drain electrodes 300a to h from the source/drain electrode 300a of the FET 100a of the first stage to the source/drain electrode 300h shared by the FET 100g of the seventh stage and the FET 100h of the eighth stage.

Example 2

Example 2 is the semiconductor apparatus 10a as shown in FIG. 3. Particularly, Example 2 is similar to Example 1 except that a metal film 306a has a shape different from that of the metal film 306 of Example 1. In other words, the metal film 306a of the semiconductor apparatus 10a according to Example 2 has a right angled isosceles triangle shape similar to that of the metal film 306 in Example 1, but has a shape in which the hypotenuse of the right angled isosceles triangle is replaced by a polygonal line 308. This polygonal line 308 is a polygonal line in which two straight lines are combined, and has a shape that follows an exponential curve. More specifically, the above-described two straight lines of the polygonal line 308 intersect at the coordinates parallel-translated in the X direction and the Y direction in FIG. 3 from the apex of a right angle 330 of the above-described right angled isosceles triangle by a length corresponding to 30% of the length of sides 340a and 340b sandwiching the right angle 330.

Comparative Example

The semiconductor apparatus 90 according to the comparative example is similar to that of Example 1 except that the metal film 306 of Example 1 is not provided.

Figure 5:
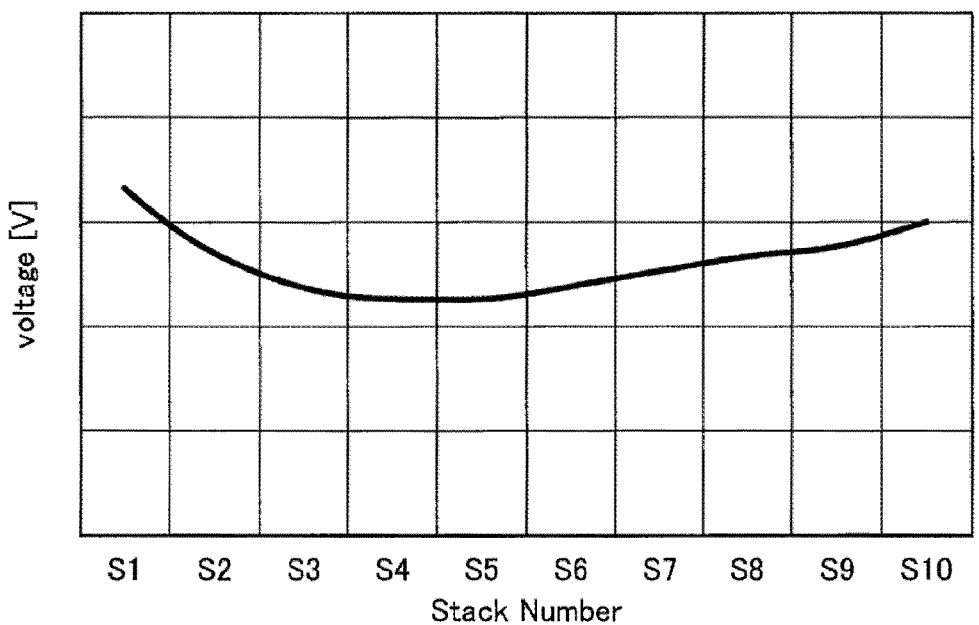
FIG. 5 is a graph showing values of voltages applied to FETs 100 of the respective stages of a semiconductor apparatus 10 according to Example 1.
Figure 6:
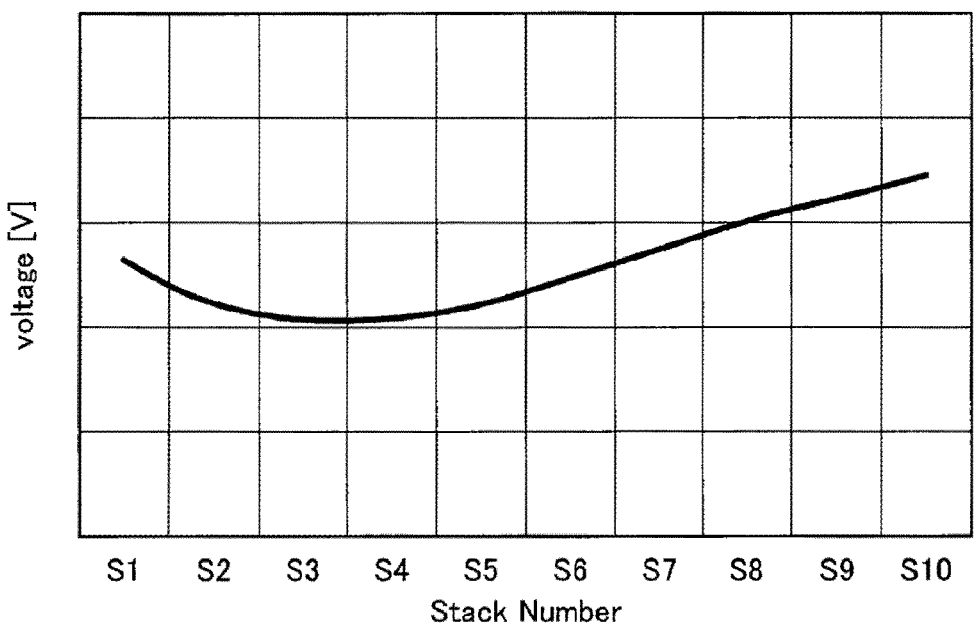
FIG. 6 is a graph showing values of voltages applied to FETs 100 of the respective stages of a semiconductor apparatus 10a according to Example 2.

The values of the voltages applied to the FETs 100 and 900 of the respective stages in the semiconductor apparatuses 10, 10a and 90 according to the above-mentioned Example 1, Example 2 and comparative example were examined by using a circuit simulator. These examination results will be described with reference to FIGS. 5, 6 and 8. FIG. 5 is a graph showing the voltage values applied to the FETs 100 of the respective stages of the semiconductor apparatus 10 according to Example 1, and FIG. 6 is a graph showing the voltage values applied to the FETs 100 of the respective stages of the semiconductor apparatus 10a according to Example 2. Furthermore, FIG. 8 is a graph showing the voltage values applied to the FETs 900 of the respective stages of the semiconductor apparatus 90 according to the comparative example. Particularly, in FIGS. 5, 6 and 8, the horizontal axis indicates the stack number of the PET 100 (900), and the vertical axis indicates the applied voltage. Note that the stack number of the FET 100 (900) is assigned to each of the FETs 100 (900) so that the number increases sequentially from a first terminal 102 (902) side toward a second terminal 104 (904) side. Moreover, for the vertical and horizontal axes of FIGS. 5, 6 and 8, the scales are set at the same interval so that the drawings can be compared with each other.

In Example as shown in FIG. 5, the voltages change according to the stack number of the FET 100, and a voltage difference between the PET 100 of the first stage to which the highest voltage is applied and the PET 100 of the fourth stage to which the lowest voltage is applied is less than the voltage difference in the comparative example in FIG. 8. Further, also in Example 2 as shown in FIG. 6, similar to Example 1, the voltages change according to the stack number of the FET 100, and a voltage difference between the FET 100 of the tenth stage to which the highest voltage is applied and the PET 100 of the fourth stage to which the lowest voltage is applied is less than the voltage difference in the comparative example in FIG. 8. In other words, it can be said that the voltages applied to the FETs 100 of the respective stages are made more even in Examples 1 and 2 than those in the comparative example. Therefore, it was found that the voltage values applied to the FETs 100 of the respective stages can be made even by providing the metal film 306 or 306a, in other words, by providing the capacitors 108.

3. Summary

As described above, in the semiconductor apparatus 10 according to the embodiment of the present disclosure, each of the plurality of capacitors 108 is provided between the first terminal 102 and each node positioned between two FETs 100 adjacent to each other, and the capacitance of each of the capacitors 108 is set to a suitable value. Thus, the voltages applied to the FETs 100 of the respective stages can be made even. Therefore, according to the present embodiment, there is no FET 100 to which a high voltage is locally applied. Thus, there is no restriction on the withstand voltage of the semiconductor apparatus 10 from the FET 100 to which a high voltage is locally applied, and the withstand voltage can be effectively enhanced according to the stack number of the FET 100. Furthermore, according to the present embodiment, since a desired withstand voltage can be obtained without using many FETs 100, it is possible to avoid the enlargement of the chip area of the semiconductor apparatus 10 and suppress the increase in the manufacturing cost.

Moreover, in the present embodiment, the capacitance of each of the capacitors 108 preferably becomes small sequentially as the stack number of the FETs 100 connected to these capacitors 108 increases. In this way, the voltages applied to the FETs 100 of the respective stages can be made more even. Further, in the present embodiment, the capacitances of the capacitors 108 connected to the FETs 100 of the respective stages are preferably sequentially reduced to cope with the transition of the voltages as the stack number of the FET 100 increases.

In the present embodiment, since the above-described plurality of capacitors 108 can be formed by providing the metal film 306 above the source/drain electrodes 300 of the respective FETs 100, the structure and arrangement of the FETs 100 do not need to be changed because of the capacitors 108 provided in this manner. In other words, in the present embodiment, since the circuit configuration and layout configuration of the existing semiconductor apparatus can be utilized as they are, it is possible to avoid the drastic change of the circuit configuration and layout configuration of the semiconductor apparatus. In addition, according to the present embodiment, the flexibility of the device design of the FETs 100 and the like can be maintained as before.

Moreover, the semiconductor apparatus 10 according to the present embodiment can be manufactured by using a method, an apparatus and conditions, which are used to manufacture a general semiconductor apparatus and a semiconductor package. In other words, the semiconductor apparatus 10 according to the present embodiment can be easily and inexpensively manufactured by using the existing semiconductor apparatus manufacturing process.

Moreover, by suitably setting the overlapping area of the above-described metal film 306 and each of the source/drain electrodes 300 of the FETs 100, the capacitance values of the capacitors 108 can be made suitable.

Further, according to the present embodiment, the passage loss of the high frequency signal in the semiconductor apparatus 10 can be decreased. The above-described passage loss correlates with the synthetic value of the ON resistances (the resistances when the FETs 100 are in the ON state) of the respective FETs 100 provided in the semiconductor apparatus 10 and the synthetic value of the OFF capacitances (the capacitances when the FETs 100 are in the OFF state). In the present embodiment, since it is not necessary to greatly increase the stack number of the FET 100, an increase in the synthetic value of the ON resistances and the OFF resistances of the plurality of FETs 100 of the semiconductor apparatus 10 can be suppressed. As a result, the passage loss of the high frequency signal in the semiconductor apparatus 10 can be decreased. Moreover, according to the present embodiment, by providing the capacitors 108, the voltages applied to the FETs 100 of the respective stages can be made even and stabilized so that the distortion characteristics of the high frequency signal can be improved.

Note that, as previously described, the semiconductor apparatus 10 according to the embodiment of the present disclosure can be applied to a terminal apparatus such as a portable telephone, a personal handyphone system (PHS) telephone, a smartphone, a personal digital assistant (PDA) apparatus with a communication function, a tablet-type personal computer apparatus, a notebook-type personal computer apparatus, and the like. Preferably, the semiconductor apparatus 10 according to the present embodiment can be applied to a terminal apparatus that performs wireless communication using a frequency of 3 GHz or less.

Furthermore, the semiconductor apparatus 10 according to the present embodiment may be mounted on the same substrate together with a demultiplexer (duplexer), a filter, an amplifier, a high frequency component such as a frequency converter, a signal processing apparatus such as a baseband circuit, an arithmetic apparatus such as a central processing unit (CPU), and the like. Alternatively, the semiconductor apparatus 10 may be incorporated into the same module together with the above-mentioned high frequency component, signal processing apparatus, arithmetic apparatus, and the like.

4. Supplement

Although the preferred embodiments of the present disclosure have been described in detail with reference to the accompanying drawings hereinabove, the technical scope of the present disclosure is not limited to these examples. It is obvious that a person ordinarily skilled in the art of the present disclosure can arrive at various changing examples or modification examples within the scope of the technical idea described in the claims, and it is to be understood that these are also within the technical scope of the present disclosure as a matter of course.

Moreover, the effects described in this specification are merely illustrative or exemplary and are not limited. That is, the technology according to the present disclosure can exert other effects obvious to those skilled in the art from the description of this specification, together with the above-described effects or instead of the above-described effects.

Note that the following configurations are also within the technical scope of the present disclosure.

(1)
A semiconductor apparatus including:
a first terminal to which a high frequency signal is supplied;
a second terminal from which the high frequency signal is output;
first, second and third switch elements electrically connected in series between the first terminal and the second terminal;
a first capacitor provided between the first terminal and a first node between the first switch element and the second switch element; and
a second capacitor provided between the first terminal and a second node between the second switch element and the third switch element,
in which the capacitance of the first capacitor is greater than the capacitance of the second capacitor.

(2)
The semiconductor apparatus according to (1),
in which the first capacitor is formed by one electrode of the first switch element provided on a semiconductor substrate and a first metal film provided above the one electrode of the first switch element through an insulating film, and
the second capacitor is formed by one electrode of the second switch element provided on the semiconductor substrate and a second metal film provided above the one electrode of the second switch element through the insulating film.

(3)
The semiconductor apparatus according to (2), in which the area of the first metal film is greater than the area of the second metal film in a case of being viewed from the top of the semiconductor substrate.

(4)
The semiconductor apparatus according to (2) or (3), in which the first and second metal films are positioned at the same layer in a laminated structure laminated on the semiconductor substrate.

(5)
The semiconductor apparatus according to (4), in which the first and second metal films are coupled to each other to form one metal film.

(6)
The semiconductor apparatus according to (2), in which the first and second metal films are positioned at different layers in a laminated structure laminated on the semiconductor substrate.

(7)
The semiconductor apparatus according to any one of (1) to (6), in which the first, second and third switch elements are field effect transistors.

(8)
A semiconductor apparatus including:
a first terminal to which a high frequency signal is supplied;
a second terminal from which the high frequency signal is output;
a plurality of switch elements electrically connected in series between the first terminal and the second terminal; and
a plurality of capacitors each provided between the first terminal and each node between two of the switch elements adjacent to each other,
in which the capacitances of the respective capacitors sequentially become small in order of the switch elements connected to the capacitors starting from the first terminal.

(9)
The semiconductor apparatus according to (8), in which the capacitances of the respective capacitors sequentially become small exponentially in the order of the switch elements connected to the capacitors starting from the first terminal.

(10)

The semiconductor apparatus according to (8) or (9), in which the respective capacitors are formed by one electrodes of the respective switch elements provided on a semiconductor substrate and respective metal films provided above the one electrodes of the respective switch elements through an insulating film.

(11)

The semiconductor apparatus according to (10), in which overlapping areas of the metal films and the respective electrodes sequentially become small in order of the switch elements for the electrodes starting from the first terminal.

(12)

The semiconductor apparatus according to (10) or (11), in which the respective metal films are positioned at the same layer in a laminated structure laminated on the semiconductor substrate.

(13)

The semiconductor apparatus according to (12), in which the respective metal films are coupled to each other to form an integrated metal film.

(14)

The semiconductor apparatus according to (13), in which the integrated metal film has a shape of a right angled triangle.

(15)

The semiconductor apparatus according to (14), in which a hypotenuse of the right angled triangle is a polygonal line.

(16)

The semiconductor apparatus according to (10), in which the respective metal films are positioned at different layers in a laminated structure laminated on the semiconductor substrate.

(17)

A high frequency module including:
a semiconductor apparatus including:
a first terminal to which a high frequency signal is supplied;
a second terminal from which the high frequency signal is output;
first, second and third switch elements electrically connected in series between the first terminal and the second terminal;
a first capacitor provided between the first terminal and a first node between the first switch element and the second switch element; and
a second capacitor provided between the first terminal and a second node between the second switch element and the third switch element,
the capacitance of the first capacitor being greater than the capacitance of the second capacitor; and
at least one of a high frequency component, a signal processing apparatus, and an arithmetic apparatus

REFERENCE SIGNS LIST 10, 10a, 90 Semiconductor apparatus
100, 100a to j, 900 FET
102, 902 First terminal
104, 904 Second terminal
106, 906 Third terminal
108, 108a to c Capacitor
200 Semiconductor substrate
202 Active region
204 n-type active region
206 p-type active region
208, 210, 214 Insulating film
212 Contact via
216 Support substrate
218 BOX layer
300, 300a to k Source/drain electrode
304 Gate electrode
306, 306a Metal film
308 Polygonal line
310, 312 Electrode pad
320 Wiring layer
330 Right angle
340a, 340b Side
910 Parasitic capacitance

What is claimed is:

1. A semiconductor apparatus comprising:
a first terminal to which a high frequency signal is supplied;
a second terminal from which the high frequency signal is output;
first, second and third switch elements electrically connected in series between the first terminal and the second terminal;
a first capacitor provided between the first terminal and a first node between the first switch element and the second switch element; and
a second capacitor provided between the first terminal and a second node between the second switch element and the third switch element,
wherein a capacitance of the first capacitor is greater than a capacitance of the second capacitor.

2. The semiconductor apparatus according to claim 1, wherein the first capacitor is formed by one electrode of the first switch element provided on a semiconductor substrate and a first metal film provided above the one electrode of the first switch element through an insulating film, and
the second capacitor is formed by one electrode of the second switch element provided on the semiconductor substrate and a second metal film provided above the one electrode of the second switch element through the insulating film.

3. The semiconductor apparatus according to claim 2, wherein an area of the first metal film is greater than an area of the second metal film in a case of being viewed from a top of the semiconductor substrate.

4. The semiconductor apparatus according to claim 2, wherein the first and second metal films are positioned at a same layer in a laminated structure laminated on the semiconductor substrate.

5. The semiconductor apparatus according to claim 4, wherein the first and second metal films are coupled to each other to form one metal film.

6. The semiconductor apparatus according to claim 2, wherein the first and second metal films are positioned at different layers in a laminated structure laminated on the semiconductor substrate.

7. The semiconductor apparatus according to claim 1, wherein the first, second and third switch elements are field effect transistors.

8. A semiconductor apparatus, comprising:
a first terminal to which a high frequency signal is supplied;
a second terminal from which the high frequency signal is output;

a plurality of switch elements electrically connected in series between the first terminal and the second terminal; and a plurality of capacitors each provided between the first terminal and each node between two of the switch elements adjacent to each other, wherein capacitances of the respective capacitors sequentially become small in order of the switch elements connected to the capacitors starting from the first terminal.

9. The semiconductor apparatus according to claim 8, wherein the capacitances of the respective capacitors sequentially become small exponentially in the order of the switch elements connected to the capacitors starting from the first terminal.

10. The semiconductor apparatus according to claim 8, wherein the respective capacitors are formed by one electrodes of the respective switch elements provided on a semiconductor substrate and respective metal films provided above the one electrodes of the respective switch elements through an insulating film.

11. The semiconductor apparatus according to claim 10, wherein overlapping areas of the metal films and the respective electrodes sequentially become small in order of the switch elements for the electrodes starting from the first terminal.

12. The semiconductor apparatus according to claim 10, wherein the respective metal films are positioned at a same layer in a laminated structure laminated on the semiconductor substrate.

13. The semiconductor apparatus according to claim 12, wherein the respective metal films are coupled to each other to form an integrated metal film.

14. The semiconductor apparatus according to claim 13, wherein the integrated metal film has a shape of a right angled triangle.

15. The semiconductor apparatus according to claim 14, wherein a hypotenuse of the right angled triangle is a polygonal line.

16. The semiconductor apparatus according to claim 10, wherein the respective metal films are positioned at different layers in a laminated structure laminated on the semiconductor substrate.

17. A module, comprising:

a semiconductor apparatus, including:

a first terminal to which a high frequency signal is supplied;

a second terminal from which the high frequency signal is output;

first, second and third switch elements electrically connected in series between the first terminal and the second terminal;

a first capacitor provided between the first terminal and a first node between the first switch element and the second switch element;

a second capacitor provided between the first terminal and a second node between the second switch element and the third switch element, wherein a capacitance of the first capacitor is greater than a capacitance of the second capacitor; and at least one of a high frequency component, a signal processing apparatus, and an arithmetic apparatus.

* * * * *